Dec. 24, 1968 O. B. CECIL 3,418,227

PROCESS FOR FABRICATING MULTIPLE LAYER CIRCUIT BOARDS

Filed March 31, 1966

OLIN B. CECIL
INVENTOR

E. Mickey Hubbard
ATTORNEY

United States Patent Office 3,418,227

Patented Dec. 24, 1968

3,418,227

PROCESS FOR FABRICATING MULTIPLE LAYER CIRCUIT BOARDS

Olin B. Cecil, Richardson, Tex., assignor to Texas Instruments Incorporated, Dallas, Tex., a corporation of Delaware Filed Mar. 31, 1966, Ser. No. 539,133
5 Claims. (Cl. 204—143)

This invention relates generally to the fabrication of circuit boards, and more particularly relates to a process for forming a circuit board from stock comprised of a lamination of glass fiber-filled epoxy resin, aluminum, iron and nickel.

It is often desirable to use a circuit board to which components and other devices can be welded. Conventional copper printed circuits on a phenolic board cannot be welded. Instead, all connections must be made by soldering. One, two or three mil thick nickel foil bonded to a glass fiber-filled epoxy resin can be welded with good results, but the strength of the bond between the nickel foil and the fiber glass fabric epoxy sheet is relatively low, about five pounds per square inch. A laminated foil comprised of five percent nickel, ninety percent iron and five percent commercially available aluminum. The aluminum face of this laminate can be bonded to a glass fabric-epoxy resin sheet and results in a bond some two or three times as strong as that attainable with the nickel foil, and the nickel laminate on top of the iron provides a good weld surface. The iron provides a relatively inexpensive core on which the thin, more expensive aluminum and nickel layers may be clad.

However, the laminated foil presents serious problems when forming the circuits using selective etching techniques. Because of the relatively slow etch rate of the nickel layer at the surface of the foil as compared with the iron core, standard etching techniques for forming the circuit board from the sheet material results in very thin overhanging lips of nickel along every edge. These overhanging lips are easily sheared by handling of the circuit board and this results in rather long, loose lengths of fine wire which can short circuit the board.

Therefore, an important object of this invention is to provide a process for fabricating a circuit board from the laminated stock material in a manner to eliminate the overhanging lip and thereby to eliminate the danger of a short circuit.

Another object of the invention is to provide such a process which is relatively simple and inexpensive to carry out and which may be readily adapted to mass production techniques.

In accordance with this invention, a circuit board is fabricated from starting material comprised of a nonconductive base sheet and a multilayer metallic sheet bonded to the nonconductive base sheet, the outer layer of the metallic sheet having a slower etch rate than the adjacent underlying layer, the steps of selectively etching the metallic sheet to leave conductor strips on the base sheet having an overhanging lip as a result of the faster etch rate of the underlying layer, and immersing the conductive strips in an electrochemical etchant and passing a current between the conductor strips and the electrochemical etchant to selectively remove the overhanging lip as the result of a concentration of the current in the lip.

The novel features believed characteristic of this invention are set forth in the appended claims. The invention itself, howeevr, as well as other objects and advantages thereof, may best be understood by reference to the following detailed description of an illustrative embodiment, when read in conjunction with the accompanying drawings, wherein:

Figure 1:
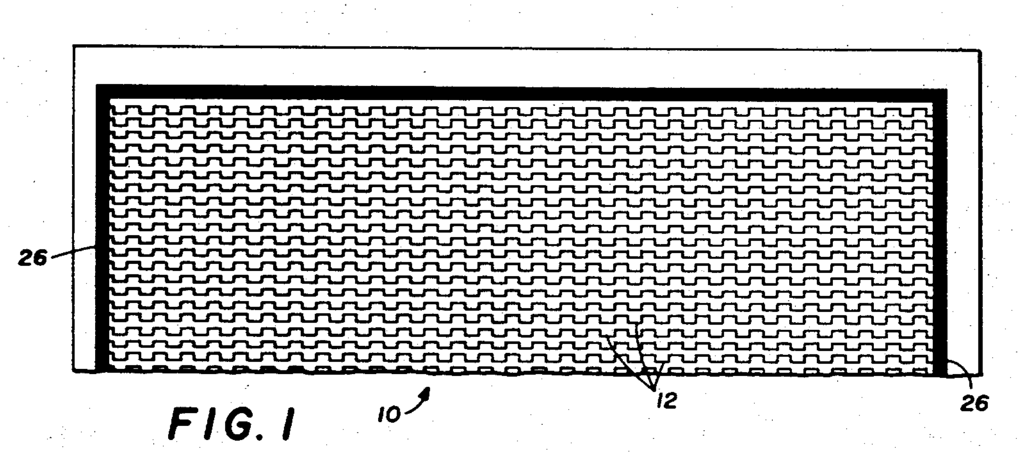
FIGURE 1 is a partial plan view of a typical circuit board which may be processed in accordance with the present invention.

Referring now to the drawings, a typical printed circuit board which may be fabricated in accordance with this invention is indicated generally by the reference numeral 10 in FIGURE 1. The starting material for the circuit board 10 is a laminated sheet that is commercially available. The circuit board stock material is comprised of a base sheet of fiber glass fabric which is impregnated with an epoxy resin. A laminated metal sheet comprised of very thin sheets of nickel and aluminum bonded to an iron core is bonded to the base sheet by an organic adhesive with the aluminum in contact with the base sheet. Both the aluminum and nickel constitute about five percent of the thickness of the foil, and the foil may be several mils thick.

In accordance with this invention, the metal sheet is selectively etched to form the circuit using conventional selective etching techniques. For example, the metal foil may be coated with the layer of photo-resist which is then photographically processed so as to leave the photoresist only over the areas of the metal sheet that is to be retained to form the conductors of the circuit. Then the circuit is subjected to a suitable selective etching solution, such as a commercially available ferric chloride etching solution, so as to remove the exposed areas of the metal film, thus leaving only the protected portion of the metal film that is to form the conductor, such as the conductor 12 in FIGURE 1.

Figure 2:
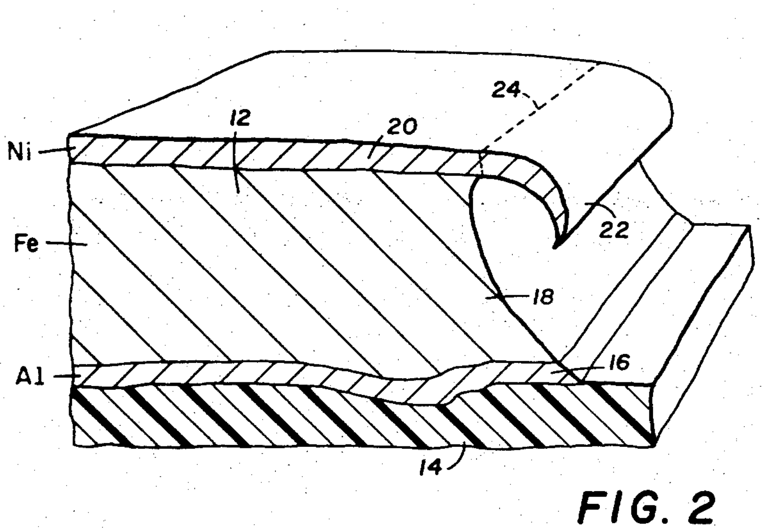
FIGURE 2 is a greatly enlarged cross-sectional view of one edge of a conductor of a printed circuit board after the etching step of the process of this invention.

After the remaining photo-resist is stripped from the surface of the remaining conductors 12, the edge of the conductors typically appears substantially as illustrated in the sectional view of FIGURE 2. In FIGURE 2 the fiber glass fabric-epoxy resin base sheet is indicated at 14, the aluminum layer at 16, the iron layer at 18 and the nickel layer at 20. As a result of the appreciable difference in the etch rate of the iron layer 18 and the nickel layer 20, an overhanging lip 22 of nickel usually remains and extends substantially the length of each of the conductors 12. The lip 22 is highly susceptible to being sheared generally along the dotted line 24 while the circuit board is handled during subsequent processing, resulting in relatively long, very fine wires which tend to become loose at one end and contact one of the adjacent conductors, thereby short-circuiting the circuit board.

Figure 3:
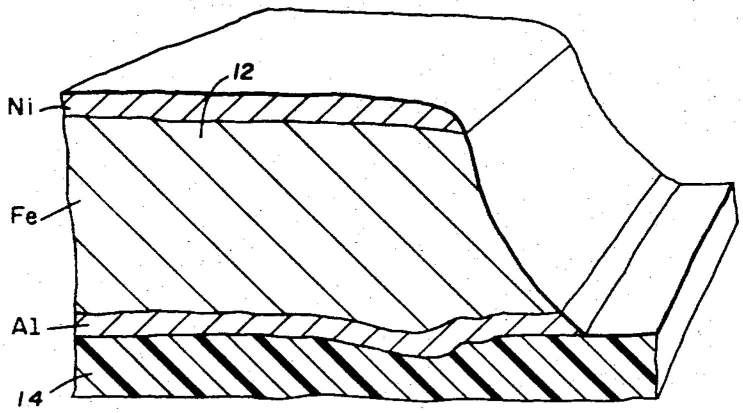
FIGURE 3 is an enlarged sectional view similar to FIGURE 2 showing the edge of the conductor after being processed in accordance with the present invention.

The lip 22 is selectively removed by immersing the conductor 12 in a suitable electrochemical etchant or electrolyte and passing a high density current between the conductor 12 and the electrochemical etchant. As a result of the high surface area and low cross-sectional area of the lip portion 22, the current will tend to concentrate in the lip 22 and selectively remove the lip at a much greater rate than the remaining portion of the conductor 12. As a result, the lip 22 can be completely removed, resulting in a smooth edge substantially as illustrated in FIGURE 3, with no deleterious affect on the remaining portion of the conductor.

More specifically, the conductors 12 may be connected as the anode in a conventional electroplating tank filled with a suitable electrochemical etchant. The etchant may comprise a solution of about fifteen percent sulfuric acid in water. The other electrode in the etchant may be stainless steel. Electrical contact may be made with all of the conductors 12 by means of a metallic border 26 formed around the periphery of the circuit board which is in electrical contact with each end of each of the conductors 12, substantially as illustrated in FIGURE 1, or by any other suitable means. The metallic border 26 can, of course, be formed by the same selective etching techniques used to form the conductors 12. After the circuit board is immersed in the electrochemical etchant, a high current is passed through the conductors for a short period of time, typically 500 amps per square feet for from one to three minutes. The current density may vary over a considerable range, depending upon the nature of the circuit board. Of course, the period of time will depend upon the current density and the size of the lip being removed. After the lip 22 has been removed, the electrode border 26 can be removed from the circuit by a mechanical shear or other suitable means.

From the foregoing detailed description of a preferred embodiment of the invention, it will be appreciated that a relatively inexpensive and highly effectively method for removing the lip 22 has been described. The process has no deleterious effect upon the circuit board and is amenable to mass production. The resulting circuit board can be welded and yet has a high bond strength between the conductors 12 and the base sheet 14. Although a specific application of the invention has been described in detail, it is to be understood that the invention is applicable to circuit boards formed from other laminated stock which results in such a lip after selective etching.

What is claimed is:

1. In a process for fabricating a circuit board from starting material comprised of a nonconductive base and multiple layers of metallic foils the outer layer of foil having a slower etch rate than the adjacent underlying layer of foil, the steps of selectively etching the metallic foils to leave conductor strips on the base sheet having an overhanging lip as a result of the faster etch rate of the underlying layer of foil, and immersing the conductor strips in an electrochemical etchant and passing a current between the conductor strips and the electrochemical etchant to selectively remove the overhanging lip as the result of a concentration of the current in the overhanging lip.

2. The process defined in claim 1 wherein the electrochemical etchant is a solution of sulfuric acid.

3. The process defined in claim 1 wherein the metallic foil is comprised of an outer layer of nickel foil over an underlayer of iron foil.

4. The process defined in claim 1 wherein the metallic foils are selectively etched by protecting the foils only in the areas which are to form the conductors by a photoresist and subjecting the sheet to a selective etchant to remove the unmasked portion of the metallic foils.

5. In a process for forming a weldable circuit board, the steps of selectively removing a portion of a metallic laminate comprised of a layer of aluminum foil, a layer of iron foil and a layer of nickel foil, the aluminum foil layer of which is bonded to a nonconductive base by masking the nickel foil surface of the metallic laminate in the areas to be retained with a photo-resist and subjecting the exposed areas of the metallic laminate to a selective etchant to remove the metallic laminate from the base in the exposed areas, and then placing the remaining portions of the metallic laminate in an electrochemical etchant and passing a current between the metallic laminate and the electrochemical etchant whereby any overhanging nickel foil lips formed at the edge of the metallic laminate as a result of the different etch rates of the nickel and iron will be selectively removed by concentration of current in the lips.

References Cited

UNITED STATES PATENTS

| | | | |
|---|---|---|---|
| 2,421,607 | 6/1947 | Fowler | 204—143 |
| 2,995,502 | 8/1961 | Ramirez et al. | 204—143 |
| 3,314,869 | 4/1967 | Dobbin et al. | 204—143 |

ROBERT K. MIHALEK, *Primary Examiner.*

U.S. Cl. X.R.

156—7